(12) United States Patent
Stone

(10) Patent No.: US 6,713,684 B2
(45) Date of Patent: Mar. 30, 2004

(54) HOLE GRID ARRAY PACKAGE AND SOCKET TECHNOLOGY

(75) Inventor: Brent S. Stone, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/985,126

(22) Filed: Nov. 1, 2001

(65) Prior Publication Data

US 2003/0079908 A1 May 1, 2003

(51) Int. Cl.[7] ................................................. H05K 1/16
(52) U.S. Cl. ...................... 174/260; 174/261; 174/52.4; 361/760; 361/785; 361/787; 361/801; 257/727; 257/698
(58) Field of Search ................................ 174/260, 266, 174/52.4; 361/760, 769, 783, 785, 787, 801, 802, 803; 257/727, 698

(56) References Cited

U.S. PATENT DOCUMENTS 5,688,140 A * 11/1997 McHugh et al. ............ 439/342
5,905,638 A * 5/1999 MacDonald, Jr. et al. .. 361/769
5,973,924 A * 10/1999 Gillespie, Jr. ............... 361/735
6,219,241 B1 * 4/2001 Jones .......................... 361/704
6,243,267 B1 * 6/2001 Chuang ....................... 361/704

FOREIGN PATENT DOCUMENTS

JP         410261758 A * 9/1998
JP         2000031617 A * 1/2000

* cited by examiner

Primary Examiner—Kamand Cuneo
Assistant Examiner—I B Patel
(74) Attorney, Agent, or Firm—Kenyon & Kenyon

(57) ABSTRACT

A chip interface assembly and method of assembling a chip interface provide enhanced performance. The chip interface assembly includes a semiconductor package and a socket. The semiconductor package has a female contact architecture, where the female contact architecture is mated with a male contact architecture of the socket. By reversing the traditional male/female arrangement of conventional interconnection interfaces, difficulties associated with signaling throughput, clearance, hardware complexity and electrical losses can be obviated.

27 Claims, 3 Drawing Sheets

HOLE GRID ARRAY PACKAGE AND SOCKET TECHNOLOGY

BACKGROUND OF THE INVENTION

1. Technical Field

The present invention generally relates to semiconductor packages and printed circuit board sockets. More particularly, the invention relates to a chip interface assembly having a hole grid array architecture.

2. Discussion

In the highly competitive computer industry, the trend toward higher processing speeds, reduced costs, and increased functionality is well documented. While this trend is desirable to the consumer, it presents significant challenges to motherboard designers as well as manufacturers. A particular area of concern relates to the socket that often provides interconnection between the semiconductor package and the motherboard or other printed circuit board (PCB). The socket enables an integrated circuit (IC) such as a computer processor to communicate with other components resident on the motherboard such as the main system memory, the basic input and output system (BIOS) and the motherboard chipset itself. While a number of sockets and slots have been developed over the years in order to facilitate this interconnection, the increasing speed of input/output (I/O) signaling in processor applications, the demand for lower costs, and the rapidly growing number of features have all presented a number of difficulties to industry participants.

A few particular difficulties relate to signaling throughput, hardware complexity, component clearance, and electrical losses. A conventional chip interface assembly includes a semiconductor package, a socket and an interconnection interface that passes I/O signals and reference signals between the package and the socket. While a number of interconnection interface architectures have evolved over the years, many of the above concerns remain. For example, one approach is to couple a male contact architecture, such as an array of pins, to the semiconductor package and provide the socket with a female contact architecture, such as a corresponding array of holes. Such a configuration is often referred to as a pin grid array (PGA). The above-described trend toward faster signaling, however, has dictated a sharp increase in the number of I/O pins required to achieve the desired signaling throughput. As a result, pin pitches have decreased correspondingly in order to satisfy space limitations. It has been determined, however, that there are manufacturing limitations on the number of pins that can be placed in a given area. Specifically, alignment tolerances and pin diameters are particular issues of concern. For example, as the pin diameter reduces, the strength of the pin also has a tendency to reduce. In fact, designers of conventional PGA packages have had considerable difficulty in reducing pin pitches below one millimeter as a result of the above concerns.

Furthermore, manufacturing capabilities have limited the ability to reduce the height of the pins on the semiconductor package beyond certain levels. As a result, the overall height of a PGA based chip interface assembly has a practical minimum value. Thus, the traditional PGA approach can have undesirable clearance consequences. In this regard, it should be noted that PGA packages typically require the socket to use a top cover, which moves the pins toward the contacts in the socket, and that this top cover increases the overall height of the chip interface assembly. In addition to clearance problems, the result can be electrical losses in the chip interface assembly such as an increase in self-inductance and/or loop inductance.

Other approaches to the chip interface assembly have involved coupling lands or balls to the socket interface surface of the semiconductor package and disposing a corresponding plurality of pads on the package interface surface of the socket. This approach is commonly referred to as the land grid array (LGA) or the ball grid array (BGA) approach. A compressive load is applied to the package and/or socket in order to force the lands or balls into electrical contact with the socket pads. While LGA and BGA packages allow for pin pitches to be reduced below one millimeter, the high uniform compressive load that must be maintained requires relatively complex mechanical hardware, which leads to increased costs. Thus, many of the conventional techniques fail to provide an ideal solution with respect to signaling throughput, cost, clearance and electrical losses.

BRIEF DESCRIPTION OF THE DRAWINGS

The various advantages of the present invention will become apparent to one skilled in the art by reading the following specification and appended claims, and by referencing the following drawings, in which:

DETAILED DESCRIPTION OF THE PREFERRED EMBODIMENTS

A chip interface assembly and method of assembling a chip interface provide enhanced performance. The chip interface assembly includes a semiconductor package and a socket. The semiconductor package has a female contact architecture, where the female contact architecture is mated with a male contact architecture of the socket. By reversing the traditional male/female arrangement of conventional interconnection interfaces, difficulties associated with signaling throughput, clearance, hardware complexity and electrical losses can be obviated.

In another aspect of an embodiment of the present invention, a semiconductor package is provided. The semiconductor package includes a substrate having a socket interface surface and surfaces defining a hole grid array (HGA) in the socket interface surface. The package further includes an electrically conductive material coupled to the surfaces defining the HGA such that the electrically conductive material enables electrical connection between the socket side of the substrate and one or more integrated circuit (IC) layers of the substrate.

Further in accordance with one embodiment of the present invention, a socket includes a base and a plurality of contacts disposed within the base. The contacts have first ends extending beyond a package interface surface of the base such that contacts enable the socket to be mated with a female contact architecture of a semiconductor package. It is preferred that the first ends of the contact have a curvature such that the curvature results in a springe force when the contacts are mated with the female contact architecture.

Yet another aspect of an embodiment of the invention provides a method of assembling a chip interface. A semiconductor package having a female contact architecture is provided. The method further provides for positioning a male contact architecture of a socket within the female contact architecture. An actuation mechanism is manipulated in a first direction such that manipulation of the actuation mechanism causes an outer body to force the female contact architecture into engagement with the male contact architecture.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

Figure 1:
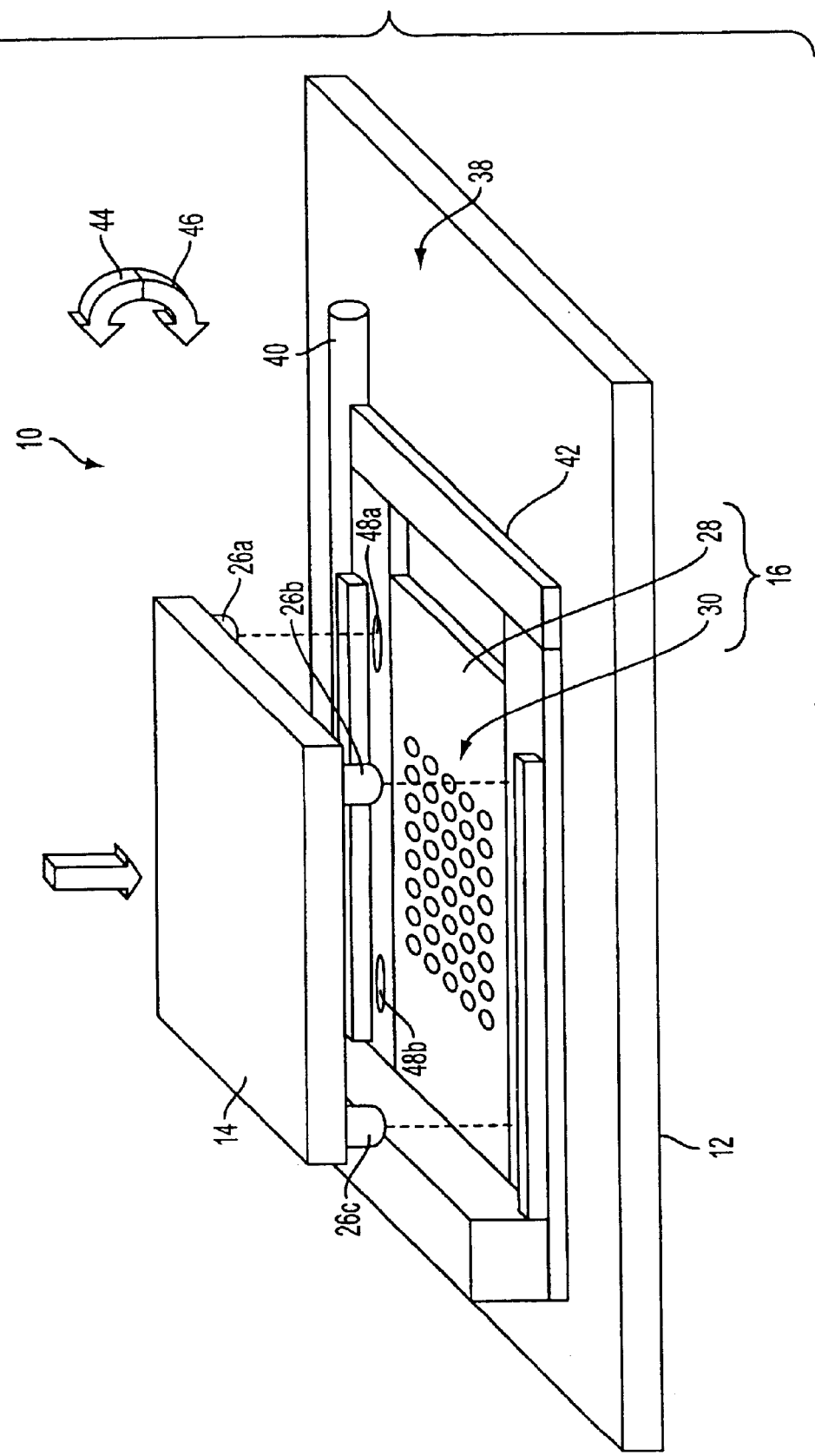
FIG. 1 is a partially exploded perspective view of an example of a chip interface assembly in accordance with one embodiment of the present invention.
Figure 3:
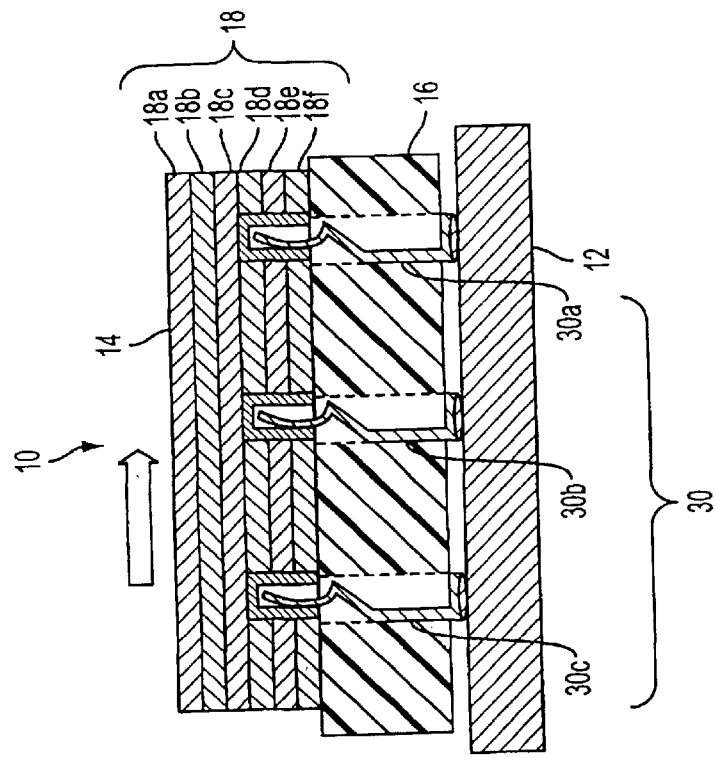
FIG. 3 is a sectional view of an example of a chip interface assembly after the components are mated in accordance with one embodiment of the present invention.
Figure 2:
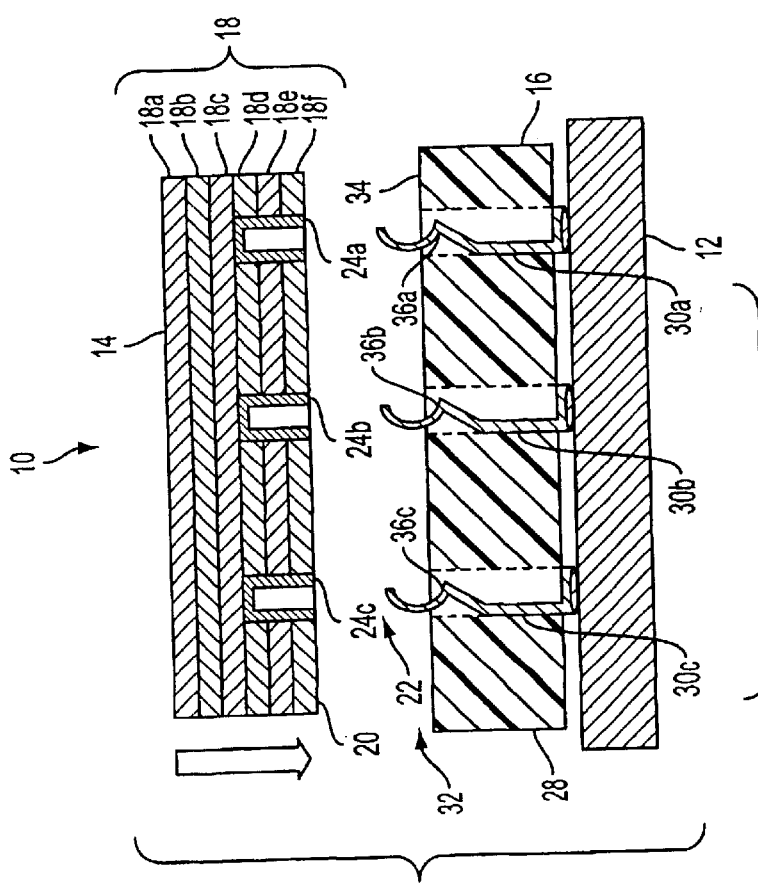
FIG. 2 is a sectional view of an example of a chip interface assembly before mating of the components in accordance with one embodiment of the present invention.

FIGS. 1–3 show a chip interface assembly 10 according to one embodiment of the present invention. The assembly 10 is electrically connected to a printed circuit board (PCB) 12, which can be a motherboard commonly used in the computing industry. As best shown in FIGS. 2 and 3, the assembly 10 is connected to the PCB 12 by surface mount technology (SMT). It should be noted, however, that through hole mount (THM) socket technology can also be used without parting from the spirit and scope of the invention. Furthermore, although the interface assembly 10 will be primarily described with respect to a computing environment, the invention is not so limited. In fact, the interface assembly 10 can be useful in any environment in which the issues of signaling throughput, cost, clearance or electrical losses are of concern. Notwithstanding, there are a number of aspects of computing for which the interface assembly 10 and other embodiments are uniquely suited.

Generally, the interface assembly 10 includes a semiconductor package 14 and a socket 16. The semiconductor package 14 typically has one or more integrated circuit (IC) layers 18 in accordance with well established principles in the semiconductor manufacturing industry. It can be seen that the semiconductor package 14 has a female contact architecture, where the female contact architecture is mated with a male contact architecture of the socket 16.

More particularly, the semiconductor package 14 includes a substrate having a socket interface surface 20. Furthermore, surfaces define a hole grid array (HGA) 22 in the socket interface surface 20. An electrically conductive material 24 is coupled to the surfaces defining the HGA 22 such that the electrically conducted material 24 enables electrical connection between the socket side of the substrate and one or more of the IC layers 18. In the illustrated example, electrical connection is provided to IC layer 18c. It is preferred that the electrically conductive material 24 includes metal plating such as copper, which can be applied in accordance with any number of techniques widely used in the industry. One approach is to pattern and etch the socket interface surface 20, and electroplate the copper to form the HGA 22.

As best shown in FIG. 1, the semiconductor package 14 further includes a package stabilization structure, such as a plurality of posts 26, extending from the socket interface surface 20 (FIGS. 2 and 3) of the substrate. It should be noted that although the illustrated posts 26 are positioned outside the field defined by the HGA 22 and have a cylindrical geometry, other configurations are possible. For example, it may be desirable to position the posts 26 within the field defined by the HGA 22, or to use another geometry such as a square cross-section, rectangular cross-section, etc.

It can further be seen that the socket 16 preferably has a base 28 and a plurality of contacts 30 disposed within the base 28. As best seen in FIGS. 2 and 3, the contacts 30 have first ends 32 extending beyond a package interface surface 34 of the base 28. It is preferred that the first ends 32 of the contacts 30 have a curvature 36 such that the curvature 36 results in a spring force when the contacts 30 are mated with the female contact architecture.

It can further be seen that the socket 16 further includes an actuation mechanism 38, where the actuation 38 enables movement of the package 14 relative to the base 28 to selectively engage the contacts 30 with the female contact architecture. Specifically, the actuation mechanism 38 includes a lever 40 and an outer body 42 coupled to the lever 40 such that rotation of the lever 40 in a first direction 44 causes the outer body 42 to force the female contact architecture into engagement with the contacts 30. It can further be seen that rotation of the lever 40 in a second direction 46 causes the outer body 42 to force the female contact architecture out of engagement with the contacts 30. It is preferred that the outer body 42 includes surfaces defining a plurality of socket apertures 48, where the socket apertures 48 are operative to receive a package stabilization structure of the semiconductor package 14. Thus, in the illustrated embodiment, the socket apertures 48 receive posts 26. It will be appreciated that providing the socket apertures 48 with an oval shape enables the posts 26 to have "play" when the chip interface is assembled and disassembled.

Figure 4:
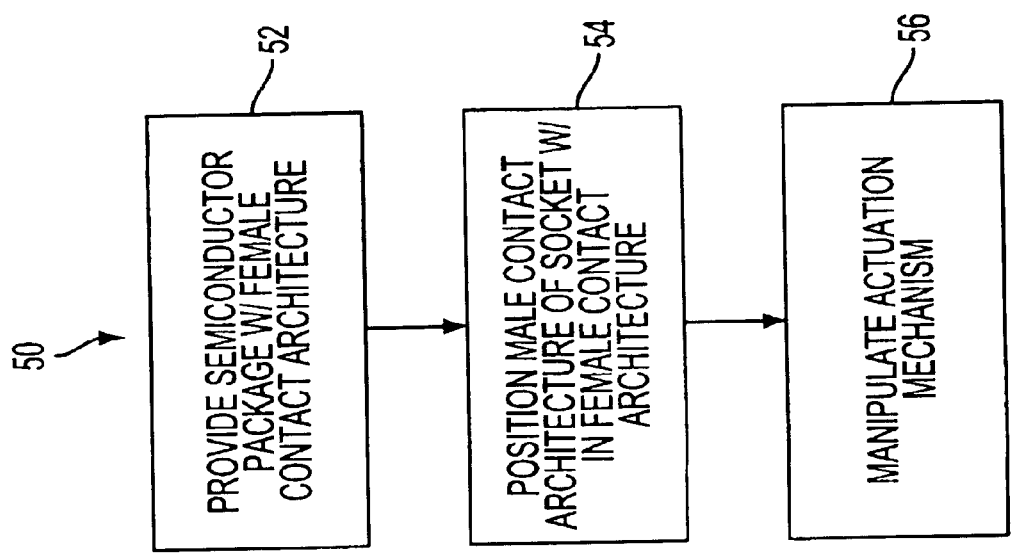
FIG. 4 is a flowchart of an example of a method of assembling a chip interface in accordance with one embodiment of the present invention.

Turning now to FIG. 4, one approach to assembling the chip interface is shown at method 50. Specifically, it can be seen that a semiconductor package having a female contact aperture is provided at processing block 52. Block 54 provides for positioning a male contact aperture of a socket within the female contact aperture. An actuation mechanism is manipulated at block 56 in a first direction such that manipulation of the actuation mechanism causes an outer body to force the female contact architecture into engagement with the male contact aperture. As already discussed, it is preferred the semiconductor package has surfaces defining an HGA and an electrically conductive material coupled to the surfaces defining the HGA. Furthermore, first ends of the contacts have a curvature such that the curvature results in a spring force when the contacts are mated with the female contact architecture.

Thus, the above-described structures and methods enable hole pitches less than one millimeter to be achieved. As a result, signaling throughput is significantly enhanced. Furthermore, the complexity of the HGA approach is less than that of conventional LGA and BGA approaches. Clearance issues are also obviated due to the elimination of the requirement of a top cover. Furthermore, self-inductance as well as loop inductance can be decreased due to a deduction is overall socket height.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and following claims.

What is claimed is:

1. A chip interface assembly comprising:
   a semiconductor package;
   a socket; and
   said semiconductor package having a package substrate with a rigid integrated circuit layer with a female contact architecture, the female contact architecture being mated with a male contact architecture of the socket.

2. The interface assembly of claim 1 wherein the semiconductor package includes:
   a substrate having a socket interface surface;
   surfaces defining a hole grid array in the socket interface surface; and
   an electrically conductive material lining the surfaces defining the hole grid array, the electrically conductive material to enable electrical connection between a socket side of the substrate and one or more integrated circuit (IC) layers of the substrate.

3. The interface assembly of claim 2 wherein the electrically conductive material includes metal plating.

4. The interface assembly of claim 2 wherein the semiconductor package further includes a package stabilization structure extending from the socket interface surface of the substrate.

5. The interface assembly of claim 4 wherein the package stabilization structure includes a plurality of posts.

6. The interface assembly of claim 5 wherein the posts are positioned outside a field defined by the hole grid array.

7. The interface assembly of claim 5 wherein the posts have a cylindrical geometry.

8. The interface assembly of claim 1 wherein the socket includes:
   a base; and
   a plurality of contacts disposed within the base;
   said contacts having first ends extending beyond a package interface surface of the base.

9. The interface assembly of claim 8 wherein the first ends of the contacts have a curvature, the curvature to result in a spring force if the contacts are mated with the female contact architecture.

10. The interface assembly of claim 8 wherein the socket further includes an actuation mechanism, the actuation mechanism enabling movement of the package relative to the base to selectively engage the contacts with the female contact architecture.

11. The interface assembly of claim 10 wherein the actuation mechanism includes:
    a lever; and
    an outer body operatively coupled to the lever, rotation of the lever in a first direction to cause the outer body to force the female contact architecture into engagement with the contacts and rotation of the lever in a second direction causes the outer body to force the female contact architecture out of engagement with the contacts.

12. The interface assembly of claim 11 wherein the outer body includes surfaces defining a plurality of socket apertures, the socket apertures operative to receive a package stabilization structure of the semiconductor package.

13. The interface assembly of claim 12 wherein the socket apertures are operative to receive a plurality of posts.

14. The interface assembly of claim 12 wherein the socket apertures have an oval shape.

15. A semiconductor package comprising:
    a package substrate having a socket interface surface;
    surfaces defining a hole grid array (HGA) in the socket interface surface; and
    an electrically conductive material lining the surfaces defining the HGA, the electrically conductive material to enable electrical connection between a socket side of the package substrate and one or more integrated circuit (IC) layers of the package substrate.

16. The package of claim 15 wherein the electrically conductive material includes metal plating.

17. The package of claim 15 further including a package stabilization structure extending from the socket interface surface of the substrate.

18. The package of claim 17 wherein the package stabilization structure includes a plurality of posts.

19. The package of claim 18 wherein the posts are positioned outside a field defined by the HGA.

20. The package of claim 18 wherein the posts have a cylindrical geometry.

21. A socket comprising:
    a base; and
    a plurality of contacts disposed within the base;
    said contacts having first ends extending beyond a package interface surface of the base, the contacts to the socket are mated with a rigid integrated circuit layer having a female contact architecture of a package substrate of a semicondutor package.

22. The socket of claim 21 wherein the first ends of the contacts have a curvature, the curvature to result in a spring force when the contacts are mated with the female contact architecture.

23. The socket of claim 21 further including an actuation mechanism, the actuation mechanism enabling movement of the package relative to the base to selectively engage the contacts with the female contact architecture.

24. The socket of claim 23 wherein the actuation mechanism includes:
    a lever; and
    an outer body operatively coupled to the lever such that rotation of the lever in a first direction causes the outer body to force the female contact architecture into engagement with the contacts and rotation of the lever in a second direction causes the outer body to force the female contact architecture out of engagement with the contacts.

25. A chip interface assembly comprising:
    a package substrate having a socket interface surface;
    surfaces defining a hole grid array (HGA) in the socket interface surface;
    a metal plating lining the surfaces defining the HGA, the metal latin to enable electrical connection between a socket side of the package substrate and one or more integrated circuit (IC) layers of the package substrate;
    a socket having a base; and
    a plurality of contacts disposed within the base;
    said contacts having first ends extending beyond a package interface surface of the base and second ends coupled to a printed circuit board (PCB);

said first ends of the contacts having a curvature, the curvature to result in a spring force if the socket is mated with the HGA.

26. The interface assembly of claim 25 further including a package stabilization structure extending from the board side of the substrate.

27. The interface assembly of claim 25 further including an actuation mechanism, the actuation mechanism enabling movement of the substrate relative to the base to selectively engage the contacts with the HGA.

* * * * *